US008184438B2

(12) United States Patent
Kaneko et al.

(10) Patent No.: US 8,184,438 B2
(45) Date of Patent: May 22, 2012

(54) CONTROL DEVICE

(75) Inventors: Yujiro Kaneko, Hitachinaka (JP); Masahiko Asano, Mito (JP); Hideto Yoshinari, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/389,220

(22) Filed: Feb. 19, 2009

(65) Prior Publication Data

US 2009/0262503 A1    Oct. 22, 2009

(30) Foreign Application Priority Data

Mar. 31, 2008   (JP) ................................. 2008-091580

(51) Int. Cl.
*H05K 7/00* (2006.01)
*H05K 7/20* (2006.01)
*H05K 1/00* (2006.01)
*F28F 7/00* (2006.01)
*A47B 81/00* (2006.01)

(52) U.S. Cl. ........ 361/705; 361/728; 361/709; 361/711; 361/719; 439/76.2; 165/80.2; 165/80.3; 312/223.2

(58) Field of Classification Search .................. 361/706, 361/709, 711, 719, 728, 705; 165/80.2–80.3; 312/223.2; 439/76.2
See application file for complete search history.

(56) References Cited

U.S. PATENT DOCUMENTS

| 4,218,724 | A | * | 8/1980 | Kaufman | 361/736 |
| 4,409,641 | A | * | 10/1983 | Jakob et al. | 361/720 |
| 4,899,256 | A | * | 2/1990 | Sway-Tin | 361/715 |
| 5,381,304 | A | * | 1/1995 | Theroux et al. | 361/706 |
| 5,397,921 | A | * | 3/1995 | Karnezos | 257/779 |
| 5,548,481 | A | * | 8/1996 | Salisbury et al. | 361/709 |
| 5,602,451 | A | * | 2/1997 | Kohge et al. | 318/293 |
| 5,604,978 | A | * | 2/1997 | Sherif et al. | 29/840 |
| 5,623,394 | A | * | 4/1997 | Sherif et al. | 361/705 |
| 5,699,235 | A | * | 12/1997 | Tsurumiya et al. | 361/803 |
| 5,757,620 | A | * | 5/1998 | Edwards et al. | 361/705 |
| 5,785,394 | A | * | 7/1998 | Volpe et al. | 303/119.2 |
| 5,812,375 | A | * | 9/1998 | Casperson | 361/707 |

(Continued)

FOREIGN PATENT DOCUMENTS

EP        1 508 915 A2    2/2005

(Continued)

OTHER PUBLICATIONS

Japanese Office Action including English translation dated Apr. 27, 2010 Nine (9) pages.

(Continued)

*Primary Examiner* — Bradley Thomas
(74) *Attorney, Agent, or Firm* — Crowell & Moring LLP

(57) ABSTRACT

A modular control device comprises a control board, a sub-module and a housing cover, with a microcomputer mounted on the control board. The sub-module has a sub-module case provided with a wiring layer that is mounted into a wall of the sub-module case. Electronic parts are mounted in the sub-module case to electrically connect to the control board through the wiring layer. A housing cover accommodates the control board and the sub-module. A housing base is joined with the housing cover. The accommodation portion has a shape corresponding to a shape of each of the electronic parts is arranged in the housing cover. The sub-module is mounted to the housing cover with a heat radiation adhesive between the accommodation portion and each of the electronic parts.

8 Claims, 4 Drawing Sheets

U.S. PATENT DOCUMENTS

| | | | |
|---|---|---|---|
| 5,847,929 A * | 12/1998 | Bernier et al. | 361/719 |
| 6,028,770 A * | 2/2000 | Kerner et al. | 361/704 |
| 6,082,443 A * | 7/2000 | Yamamoto et al. | 165/104.26 |
| 6,116,916 A * | 9/2000 | Kasai | 439/76.2 |
| 6,185,101 B1 | 2/2001 | Itabashi et al. | |
| 6,256,201 B1 * | 7/2001 | Ikeda et al. | 361/704 |
| 6,263,959 B1 * | 7/2001 | Ikeda et al. | 165/104.26 |
| 6,275,381 B1 * | 8/2001 | Edwards et al. | 361/717 |
| 6,282,092 B1 * | 8/2001 | Okamoto et al. | 361/704 |
| 6,317,324 B1 * | 11/2001 | Chen et al. | 361/704 |
| 6,337,796 B2 * | 1/2002 | Yamada et al. | 361/719 |
| 6,354,674 B1 * | 3/2002 | Iwamoto et al. | 303/119.3 |
| 6,411,507 B1 * | 6/2002 | Akram | 361/690 |
| 6,445,568 B1 * | 9/2002 | Baur et al. | 361/600 |
| 6,522,528 B2 * | 2/2003 | Yamane | 361/601 |
| 6,560,115 B1 * | 5/2003 | Wakabayashi et al. | 361/728 |
| 6,740,814 B2 * | 5/2004 | Ohta et al. | 174/68.1 |
| 6,875,029 B2 * | 4/2005 | Kawabata et al. | 439/76.2 |
| 6,924,985 B2 * | 8/2005 | Kawakita et al. | 361/715 |
| 6,972,959 B2 * | 12/2005 | Asai et al. | 361/719 |
| 7,023,699 B2 * | 4/2006 | Glovatsky et al. | 361/704 |
| 7,031,162 B2 * | 4/2006 | Arvelo et al. | 361/718 |
| 7,110,246 B2 * | 9/2006 | Tsunooka et al. | 361/637 |
| 7,151,674 B2 * | 12/2006 | Sasaki et al. | 361/752 |
| 7,158,372 B2 * | 1/2007 | Sanada et al. | 361/752 |
| 7,230,821 B2 * | 6/2007 | Skofljanec et al. | 361/679.08 |
| 7,351,911 B2 * | 4/2008 | Chiriku et al. | 174/59 |
| 7,408,765 B2 * | 8/2008 | Kanou | 361/622 |
| 7,417,861 B2 * | 8/2008 | Kikuchi et al. | 361/718 |
| 7,556,510 B2 * | 7/2009 | Tsuruzawa et al. | 439/83 |
| 7,576,991 B2 * | 8/2009 | Naritomi | 361/748 |
| 7,643,297 B2 * | 1/2010 | Tominaga et al. | 361/704 |
| 7,667,971 B2 * | 2/2010 | Tominaga et al. | 361/706 |
| 7,672,138 B2 * | 3/2010 | Kawabata et al. | 361/752 |
| 7,697,300 B2 * | 4/2010 | Brandt et al. | 361/736 |
| 7,709,939 B2 * | 5/2010 | Yonemura et al. | 257/678 |
| 7,733,650 B2 * | 6/2010 | Okayama et al. | 361/704 |
| 7,755,907 B2 * | 7/2010 | Inagaki | 361/752 |
| 7,877,868 B2 * | 2/2011 | Tomikawa et al. | 29/841 |
| 7,916,491 B2 * | 3/2011 | Fino et al. | 361/752 |
| 2001/0021103 A1 * | 9/2001 | Takagi | 361/752 |
| 2002/0079119 A1 * | 6/2002 | Takata et al. | 174/52.2 |
| 2002/0154486 A1 * | 10/2002 | Koike et al. | 361/704 |
| 2003/0075784 A1 * | 4/2003 | Nakase et al. | 257/675 |
| 2003/0147217 A1 * | 8/2003 | Koike et al. | 361/715 |
| 2004/0004818 A1 * | 1/2004 | Kawakita et al. | 361/704 |
| 2005/0000726 A1 * | 1/2005 | Kimata et al. | 174/256 |
| 2005/0068750 A1 * | 3/2005 | Origlia | 361/752 |
| 2005/0088826 A1 * | 4/2005 | Throum | 361/719 |
| 2005/0190539 A1 * | 9/2005 | Watanabe et al. | 361/704 |
| 2005/0233619 A1 * | 10/2005 | Takeuchi et al. | 439/76.2 |
| 2006/0171127 A1 * | 8/2006 | Kadoya et al. | 361/752 |
| 2006/0181859 A1 * | 8/2006 | Thorum | 361/719 |
| 2007/0076383 A1 | 4/2007 | Sasaki et al. | |
| 2007/0134951 A1 * | 6/2007 | Inagaki et al. | 439/74 |
| 2007/0230137 A1 * | 10/2007 | Inagaki | 361/719 |
| 2007/0297152 A1 * | 12/2007 | Janisch et al. | 361/757 |
| 2008/0278918 A1 * | 11/2008 | Tominaga et al. | 361/719 |
| 2008/0294324 A1 * | 11/2008 | Yoshinari et al. | 701/102 |
| 2009/0086437 A1 * | 4/2009 | Tsuyuno et al. | 361/709 |
| 2009/0268414 A1 * | 10/2009 | Lu | 361/736 |

FOREIGN PATENT DOCUMENTS

| | | |
|---|---|---|
| EP | 1 995 439 A2 | 11/2008 |
| JP | 8-203263 A | 8/1996 |
| JP | 11-186766 A | 7/1999 |
| JP | 2001-326306 A | 11/2001 |
| JP | 2005-12127 A | 1/2005 |
| JP | 2005-129820 A | 5/2005 |
| WO | WO 2004/010754 A1 | 1/2004 |

OTHER PUBLICATIONS

European Search Report dated Jun. 10, 2010 (five (6) pages).

* cited by examiner

CONTROL DEVICE

CLAIM OF PRIORITY

This application claims priority from Japanese patent application serial No. 2008-091580, filed on Mar. 31, 2008, the content of which is hereby incorporated by reference into this application.

BACKGROUND OF THE INVENTION

The present invention is related to a control device mounted on a vehicle such as automobile, and particularly, to a heat radiating structure of the control device mounting electronic parts with heat generation such as a coil, capacitor or the like.

Recently, a control device mounted on vehicles such as automobiles or the like have a tendency of high power and high functions. Disclosed is a control device in which electronic parts are wired to each other with low resistance wirings by forming the electronic parts such as coils, capacitors, or the like as a sub-module to realize the high power and high functions.

FIG. 5 is an exploded perspective view showing a conventional control device. As shown in FIG. 5, the conventional control device as a module comprises a control board 1 mounting circuits such as a microcomputer, a sub-module 2 mounting electronic parts such as coils 8 and capacitors on a resin case 6 including wiring layers (not shown), a housing cover 3 accommodating the control board 1 and sub-module 2, and a housing base 4. The control board 1 and sub-module 2 are electrically connected to each other and fixed mechanically with screws or the like to the housing cover 3. A heat radiation fin 16 is placed on an outside surface of the housing cover 3 and a heat radiation sheet 13 is provided between the housing cover 3 and the sub-module 2. By pressing and contacting of the electronic parts to the low elasticity heat radiation sheet 13 disposed on an inner flat surface of the housing cover 3, heat from the electronic parts is radiated to the housing cover 3.

A control device using the heat radiation sheet is disclosed in Japanese laid open patent publication No. Hei 8(1996)-203263 in which a heating element disposed on a circuit board is tightly fitted into a recess portion of a housing frame through the heat radiation sheet. On the other hand, according to an electronic control device disclosed in Japanese laid open patent publication No. 2005-12127, a lid is attached so as to cover the heating element on the circuit board and a space between the lid having a heat radiation plate and heating element is filled with a heat radiation gel material.

SUMMARY OF THE INVENTION

The electronic parts such as coils and capacitors of the sub-module and the like usually accompany with heat generation. In conventional control device with a heat radiating structure using heat radiation sheets shown in FIG. 5, the thickness of the heat radiation sheet possible to be inserted between the electronic parts and a housing cover is limited from a view point of electronic parts dimensional accuracy. Also, even if inserting the heat radiation sheet by suppressing the thickness of the heat radiation sheet capable of inserting it, repellent force of the heat radiation sheet presses the electronic parts and therefore, the electronic parts will have bad influences.

Particularly, a control device accommodating the sub-module mounting different shaped electronic parts such as coils and capacitors in a housing cover fails to assure sufficient contact area corresponding to the heat radiation sheets without supplying a surplus repellent force to the mounted each electronic parts.

To solve the above problems, the present invention is to provide a control device capable of increasing the heat radiating area of the electronic parts mounted to the sub-module and improving the heat radiation ability of the sub-module.

A control device as a module of the present invention comprises a control board, a sub-module and a housing cover. A microcomputer is mounted on the control board. The sub-module has a sub-module case provided with a wiring layer into a wall of the sub-module case. Electronic parts are mounted in the sub-module case to electrically connect to the control board through the wiring layer. A housing cover accommodates the control board and the sub-module. A housing base is joined with the housing cover. The accommodation portion has a shape corresponding to a shape of each of the electronic parts is arranged in the housing cover. The sub-module is mounted to the housing cover with a heat radiation adhesive between the accommodation portion and each of the electronic parts.

The present invention is capable of increasing the heat radiating area of the electronic parts mounted to the sub-module and improving the heat radiation ability of the sub-module.

DETAILED EXPLANATION OF PREFERRED EMBODIMENTS

Suitable embodiments of the invention are explained referring to the attached drawings below.

Figure 1:
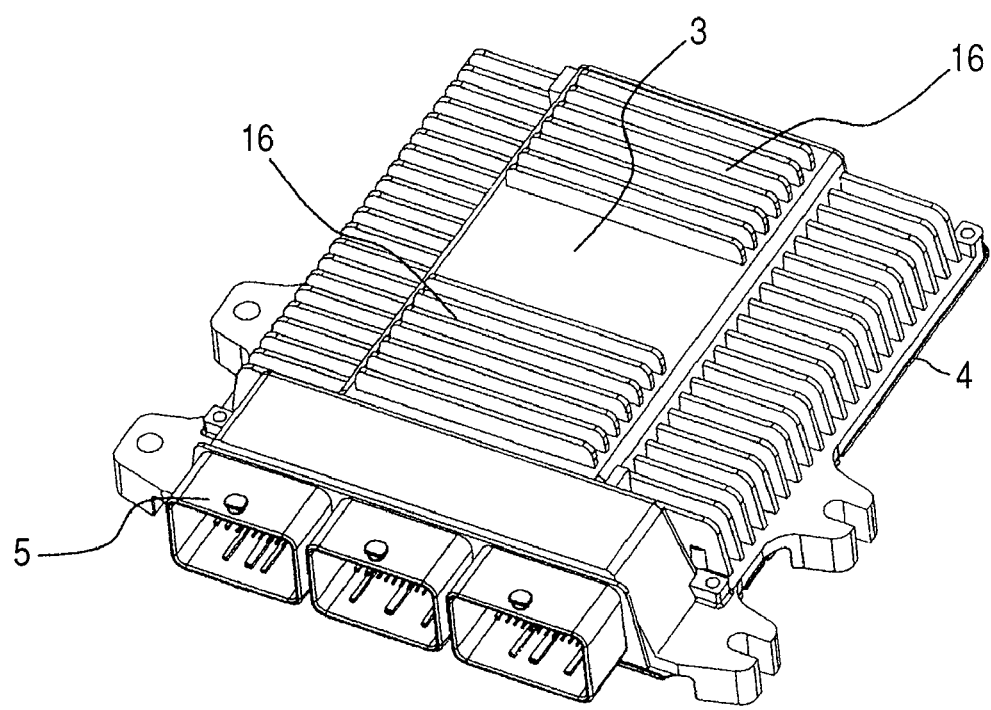
FIG. 1 is a perspective view showing a control device of a first embodiment in accordance with the present invention.
Figure 2:
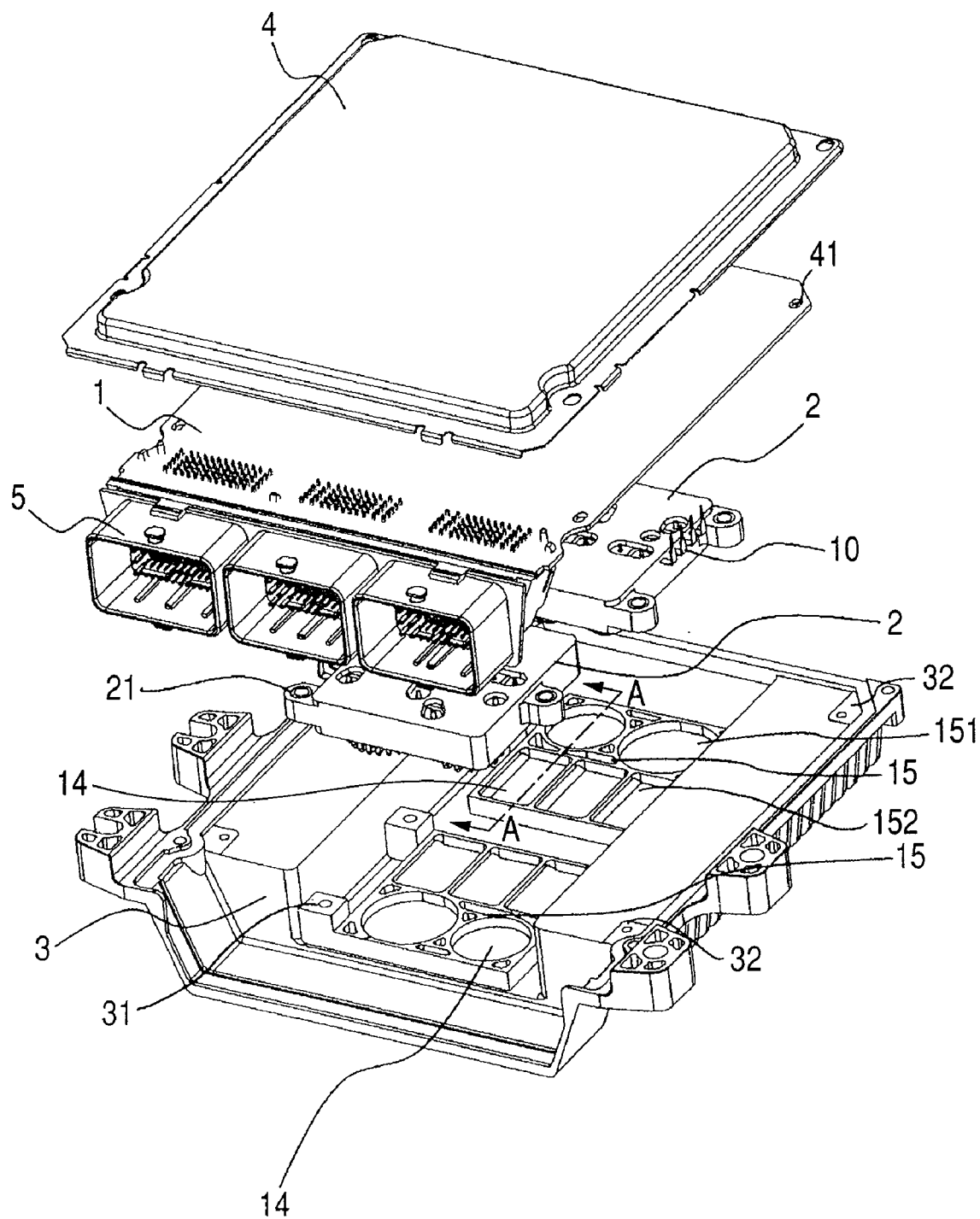
FIG. 2 is an exploded perspective view showing the control device shown in FIG. 1.
Figure 3:
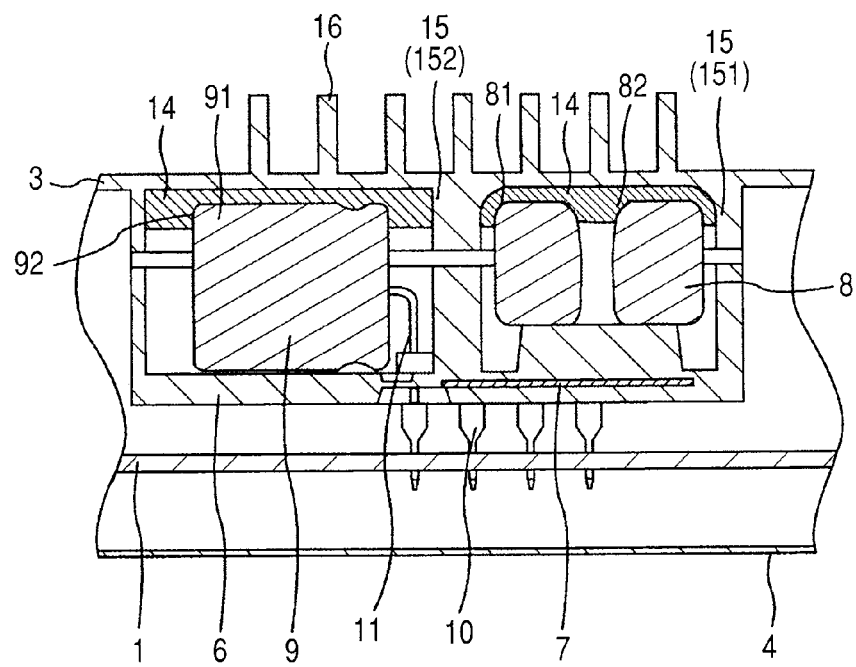
FIG. 3 is a sectional view taken along a line A-A in FIG. 2.

FIG. 1 is a perspective view showing a control device in accordance with a first embodiment of the invention. FIG. 2 is an exploded perspective view showing the control device shown in FIG. 1. FIG. 3 is an enlarged section view showing the control device along a line A-A as shown in FIG. 2. FIG. 2 is drawn being turned upside down comparing with FIGS. 1 and 3.

As shown in FIGS. 1 to 3, the control device as a module has a control board 1 mounting chips (electronic elements) such as a microcomputer and connectors 5 acting as an external interface, a sub-module 2 mounting electronic parts 8 and 9 in a sub-module case 6, a housing cover accommodating the control board 1 and the sub-module 2, and a housing base 4.

In the control device, the sub-module 2 is accommodated and fixed in a space of the housing cover 3, and the control board 1 is also fixed to the housing cover 3. Moreover, the housing cover 3 fixing the control board 1 and sub-module 2 is fastened to the housing base 4.

As shown in FIG. 3, the sub-module 2 is a LC (inductance-capacitance) module accommodating coils 8 and capacitors 9 as electronic parts in the sub-module case 6 (hereinafter the module case is referred to as a resin case). In the present embodiment, the sub-module 2 has three lateral column shaped capacitors 9 and two vertical cylindrical shape coils 8. The control device has two sub-modules 2. A part of each of the electronic parts 8 and 9 projects from the resin case 6 through an opening of the resin case 6. The coils 8 and capacitors 9 constitute one part of a voltage step-up circuit to the stepped-up voltage of a vehicle battery and apply the steppe-up voltage to an actuator. The resin case 6 is provided with a wiring layer 7 such that the wiring layer is mounted into a wall of the resin case. The wiring layer 7 is made of a metal layer having a pattern for electrically connecting the coils 8 and capacitor 9 to the control board 1.

Each of the capacitors 9 and coils 8 are connected to the wiring layer 7 through a lead wire 11 of each of the capacitors 9 and coils 8. Connection of the coils 8 and capacitors 9 with the wiring layer 7 is performed by inserting each lead wire of the coil 8 and capacitor 9 into a hole of the resin case facing the wiring layer 7 and then using lead free solder such as Sn—Cu solder, Sn—Ag—Cu solder, Sn—Ag—Cu solder, Sn—Ag—Cu—Bi solder or the like.

Welding may be available to connect the electronic parts of coils 8 and capacitors 9 with the wiring layer 7 instead of the lead free solder. The resin case 6 is provided external terminals 10 to electrically connect the wiring layer 7 and the control board 1. The resin case 6 is formed by insert molding of the wiring layer 7 which is manufactured by press working of a thick copper plate into a heat resistance resin. The sub-module 2 using the thick copper wiring layer is capable of structuring a very low resistance step-up voltage circuit comparing with the circuit wiring of the control board 1.

An accommodation portion 15 having a shape corresponding to a part of the coils 8 and capacitors 9 is formed in an inner surface of the housing cover 3 in which the sub-module 2 is mounted. Heat radiation fins 16 are formed on an outer surface of the housing cover 3 opposite to at least region where the accommodation portion 15 is positioned on the inner surface. In the present embodiment, the housing cover 3 is a cast metal formed by die cast, however, a machined product may be also available. A material of the housing cover 3 is desirable to be metal with high thermal conductivity. Aluminum and aluminum alloys are suitable for the housing cover 3 from viewpoints of mass-production, weight reduction and heat radiation ability. Besides, other metal such as iron or the like may be available.

In the embodiment, the accommodation portion is formed individually corresponding to the shape and position of the two coils 8 and three capacitors 9 mounted on the sub-module module 2. In other words, the shape of an accommodation portion 151 corresponding to the coils 8 is a circular recess. On the other hand, the shape of an accommodation portion 152 corresponding to the capacitors 9 is nearly a rectangular recess. The recess wall, that is, the wall opposing to the side surface of the lateral column shaped capacitors 9 is formed on a partial slope 153.

A heat radiation adhesive 14 is provided between the accommodation portion 15 and the electronic parts 8 and 9. The heat radiation adhesive 14 is a thermo setting type resin or humidity setting type resin that filler such as $Al_2O_3$ is added to silicone resin. The heat radiation adhesive 14 has preferably thermal conductivity of 0.5 to 5 (W/mk). In the embodiment, the heat radiation adhesive of about 1 (W/mk) is used.

A modulus of elasticity of the heat radiation adhesive from 1 to 1000 (Kpa) is desirable, and at least its elasticity is preferably lower than the coils 8 and capacitors 9 mounted on the resin case 6. Desirable penetration of the heat radiation adhesive is 10 to 50, namely, 1/10 mm depth. In the case of using low heat resistance-electronic parts 8 and 9 mounted on the sub-module, it is recommendable to use the heat radiation adhesive composed of the humidity setting type resin.

The mounting of the sub-module to the housing cover 3 is performed through the following process:

1. Firstly, the heat radiation adhesive 14 with high viscosity gel condition before curing is half-filled into the accommodation portion 15 of the housing cover 3.

2. The coils 8 and capacitors 9 are partially inserted respectively into the accommodation portion 15 half-filled with the heat radiation adhesive.

3. After that, the heat radiation adhesive 14 is cured. A sub-module side fastening portion 21 of the sub-module 2 and a housing cover side fastening portion 31 of the housing cover 3 are fastened each other using screws or the like.

4. Incidentally, the housing cover side fastening portion 31 is formed on a higher position with respect to the accommodation portion 15, that is, near position to the sub-module side. The housing cover side fastening portion 31 and the sub-module fastening portion 21 are contacted with each other, the electronic parts 8 and 9 are pushed into the heat radiation adhesive 14 to place them in the accommodation portion 15 without contacting the electronic parts 8 and 9 with the bottom of the accommodation port 15.

By pushing the electronic parts 8 and 9 into the heat radiation adhesive 14, the heat radiation adhesive 14 contacts with not only each upper surface of the electronic parts 8 and 9, namely, the surface facing the housing cover 3 but also each side surface of the electronic parts. Described concretely, the heat radiation adhesive 14 contacts with all of the upper portion 81 of each outer side of the coils 8, the upper portion 82 of each inner side of the coils 8, the upper portion 91 of each circular surface (column shaped side surface) of the capacitors 9 and the upper portion 92 of each flat surface (column shaped bottom surface) of the capacitors 9. That is, the upper sides of the coils 8 and capacitors 9 are buried into the heat radiation adhesive 14. The area where the electronic parts are buried into the heat radiation adhesive 14 is regulated less than half of the entire surface area of the electronic parts.

The control board 1 is fixed to the housing cover 3 to which the sub-module is fixed. Concretely, the control board 1 is mounted on the housing cover 3 and mechanically fastened and fixed by a screw or the like through a screw hole 41 of the control board 1 or screw hole 32 of the housing cover. An external terminal 10 of the sub-module 2 and a through hole of the control board 1 are joined by using soldering. Lead free solders such as Sn—Cu solder, Sn—Ag—Cu solder, Sn—Ag—Cu solder, Sn—Ag—Cu—Bi solder or the like are applicable as the soldering.

The control device has a structure that an opening of the housing cover 3 is covered with the housing base 4 of dish shaped body to close the opening of the housing cover 3. The housing base 4 is preferable to be structured using plated steel plates formed by press working and aluminum alloy from viewpoints of productivity and weight reduction. The housing case 4 may be suitable to be made of a heat resisting resin, that is, PET (polyethylene terephtalene) resin, or PPS resin (polyphenylene sulfide) or PBT resin (polybuthylene terephthalate). The housing base 4 formed by these resins is excellent in the weight reduction and heat resistance ability.

According to the control device of the present embodiment, the radiation area of the electronic parts 8 and 9 becomes broad and obtains high heat radiation ability through arranging the accommodation portion 15 having a shape corresponding to the electronic parts in the inner surface of the housing cover 3.

Figure 5:
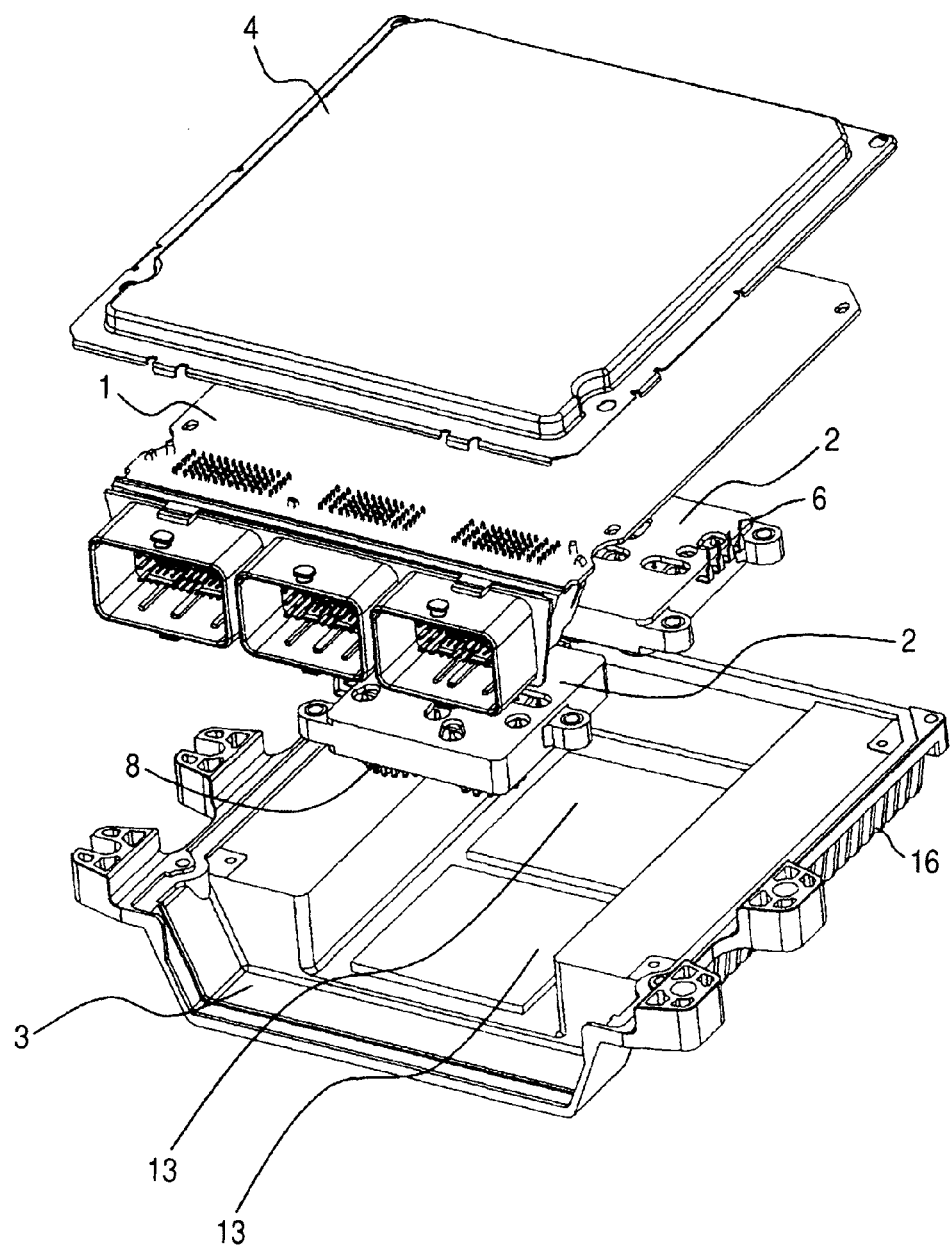
FIG. 5 is an exploded perspective view showing a traditional control device.

According to this embodiment, since the heat radiation adhesive 14 is used as a radiation member for the electronic parts accompanying with heat generation and a part of the electronic parts 8 and 9 is buried into the heat radiation adhesive 14 being provided into the accommodation portion 15 of the inner surface of the housing cover 3, the contact area of the electronic parts to the heat radiation adhesive can increase by 15% comparing with the conventional heat radiation structure using a heat radiation sheet 13 shown in FIG. 5.

The conventional heat radiation structure using a heat radiation sheet is difficult to design the sheet thickness from a viewpoint of dimensional accuracy of the electronic parts 8 and 9. On the other hand, since the electronic parts are partially buried into the heat radiation adhesive 14 such as the heat radiation structure of the control device shown in the embodiment, a gap size between the electronic parts 8, 9 and the housing cover 3 is able to be small. Therefore, further improvement of the heat radiation ability is possible.

The control device of the present embodiment, the accommodation portion 14 is arranged corresponding to each of the parts 8 and 9 in the embodiment. Therefore, it is possible to reduce an amount of providing the heat radiation member by 35% comparing with the conventional traditional control device using the heat radiation sheet and cost down becomes possible.

As electronic parts 8 and 9 are only contacted to the heat radiation adhesive 14 provided into the accommodation portion 15 without pushing the electronic parts 8 and 9 to the heat radiation sheet 13, no repellent force by pushing of the heat radiation sheet 13 (like the conventional art) act on the electronic parts 8 and 9 and the failure of the electronic parts 8 and 9 due to the repellent force are able to be prevented. Further, the electronic parts are fixed to the housing cover 3 by the accommodation portion 15 and the heat radiation adhesion 14 filled into the accommodation portion 15. As a result, the electronic parts 8 and 9 become excellent in vibration proof ability.

As the control device of the present embodiment includes a structure that the control board 1 and sub-module 2 is mechanically fastened and fixed to the housing cover 3, the control device becomes excellent in vibration proof ability comparing with the conventional one which the sub-module is mechanically fixed to the control board 1. In addition, the control board 1 is unnecessary for regions to fix the sub-module 3 and therefore, is capable of enlarging the mounting area of the control board 1.

A second embodiment is explained hereinafter.

Figure 4:
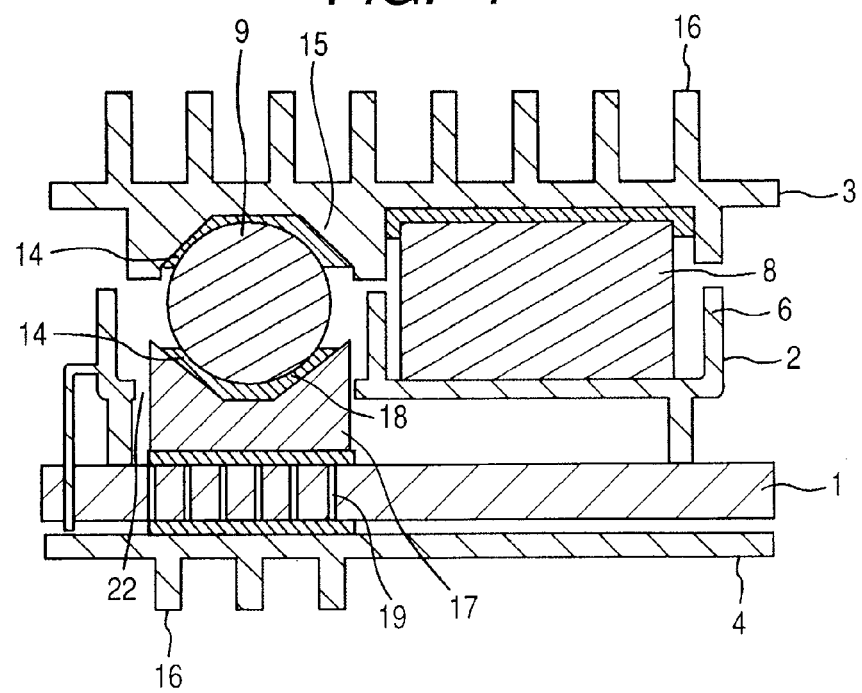
FIG. 4 is a sectional view showing a control device of a second embodiment in accordance with the present invention.

FIG. 4 is a sectional view showing an essential part of a control device of the present embodiment. The basic constituting part of the control device of the present embodiment is nearly same as that of the control device shown in FIG. 1 to FIG. 3, therefore, same reference numbers are given to the same portions. The control device differs from the first embodiment from a viewpoint of the constitution forming the accommodation portion 18 on the base 4 and radiating heat of the capacitors 9 of the sub-module from both sides of the housing cover 3 and the housing base 4.

The control device of the embodiment has a heat sink member 17 between the control board 1 and the sub-module 2. The heat sink member 17 has an accommodation portion 18 similar to the accommodation portion 15 formed on the housing cover 3. The resin case 6 is provided with an opening 22 being under the capacitors 9, and thereby each of the capacitors 9 faces to the accommodation portion 18. Both of the accommodation portion 15 of the housing cover 3 and the accommodation portion 18 of the heat sink member 17 are provided with the heat radiation adhesive 14. Furthermore, in the control board 1, radiation via holes 19, namely, thermal via holes are formed in a region on which the heat sink member 17 is placed. A radiating fin 16 is formed on the outer surface of a housing case 4 in opposition to the region where the via holes 19 are formed.

According to the second embodiment, in addition to advantages of the first embodiment of the control device, the control device is capable of radiating the heat occurred from capacitors 9 to both directions of the housing base 4 and housing cover 3 and therefore, realizing further higher radiation.

In the control device of the second embodiment, the opening 22 is although formed under the capacitors 9 placed in the resin case 6 and the capacitors 9 radiates its heat in the upper and lower directions, this structure may be available to the coils 8 or both of coils 8 and capacitors 9.

Although the two embodiments of the present invention have been described with reference to the attached drawings, the present invention is not limited to these embodiments, and a variety of modifications and changes can be made without departing from the spirit and scope of the present invention.

What is claimed is:

1. A modular control device comprising:
a control board;
a sub-module having a sub-module case;
a wiring layer mounted into a wall of the sub-module case;
a plurality of electronic parts mounted in the sub-module case to electrically connect to the control board through the wiring layer;
a housing cover accommodating the control board and the sub-module; and
a housing base joined with the housing cover; wherein,
the wiring layer is configured as a plate having lower resistance wiring for the plurality of electronic parts than a circuit wiring of the control board;
at least two of the electronic parts mounted in the sub-module case have mutually different shapes;
accommodation portions having respective different shapes corresponding to the different shapes of each of the electronic parts are arranged on an inner surface of the housing cover;
a heat radiation fin is formed on an outer surface of the housing cover;
the sub-module is disposed between the housing cover and the control board and is mounted to the housing cover with a heat radiation adhesive between each of the accommodation portions and both upper and side surfaces of each of the electronic parts; and
the electronic parts are fixed by being sandwiched between an inner surface of the sub-module case and the inner surface of the housing cover by fastening the sub-module case and the housing cover to each other.

2. The control device according to claim 1, wherein the heat radiation adhesive is provided in the accommodation portion before curing, and is cured after mounting the sub-module on the housing cover.

3. The control device according to claim 1, wherein the heat radiation adhesive is in contact with the housing cover side of the electronic parts and its contact area is less than a half of the entire surface area of the electronic parts.

4. The control device according to claim 1, wherein the control board and sub-module are fixed to said housing cover.

5. The control device according to claim 1, wherein said heat radiation fin is formed on the housing cover opposite a region where the accommodation portion is positioned on an inner surface of the housing cover.

6. The control device according to claim 1, wherein the housing cover is made of aluminum or aluminum alloy.

7. The control device according to claim 1, wherein:
the heat radiation adhesive is made of silicone resin; and
thermal conductivity of the heat radiation adhesive is 0.5 to 5 (W/mK), its modulus of elasticity is 1 to 1000 (kP) and its penetration value is in the range of 10 to 50, wherein a penetration value of 1 corresponds to a depth of 1/10 mm.

8. The control device according to claim 1, wherein:
the electronic parts are projected from an opening of the sub-module case in an exposed state; and
the sub-module is mounted on the housing cover so that the electronic parts are held with the heat radiation adhesive without contacting the bottom of the respective accommodation portions of the housing cover.

* * * * *